United States Patent
Li et al.

(10) Patent No.: US 9,490,315 B2
(45) Date of Patent: Nov. 8, 2016

(54) POWER SEMICONDUCTOR DEVICE AND METHOD OF FABRICATING THE SAME AND CUTOFF RING

(71) Applicants: PEKING UNIVERSITY FOUNDER GROUP CO., LTD., Beijing (CN); FOUNDER MICROELECTRONICS INTERNATIONAL CO., LTD., Guangdong Province (CN)

(72) Inventors: Li Li, Guangdong Province (CN); Wanli Ma, Guangdong Province (CN); Shengzhe Zhao, Guangdong Province (CN)

(73) Assignees: Peking University Founder Group Co., Ltd., Beijing (CN); Founder Microelectronics International Co., Ltd., Shenzhen (CN)

( * ) Notice: Subject to any disclaimer, the term of this patent is extended or adjusted under 35 U.S.C. 154(b) by 0 days.

(21) Appl. No.: 14/594,341

(22) Filed: Jan. 12, 2015

(65) Prior Publication Data

US 2015/0214295 A1   Jul. 30, 2015

(51) Int. Cl.
*H01L 21/00* (2006.01)
*H01L 29/06* (2006.01)
*H01L 21/762* (2006.01)
*H01L 23/00* (2006.01)

(52) U.S. Cl.
CPC ..... *H01L 29/0619* (2013.01); *H01L 21/76237* (2013.01); *H01L 24/97* (2013.01); *H01L 29/0657* (2013.01); *H01L 24/95* (2013.01); *H01L 24/96* (2013.01); *H01L 2223/5446* (2013.01)

(58) Field of Classification Search
CPC .......... H01L 29/0619; H01L 29/0657; H01L 21/76237; H01L 2223/5446; H01L 24/95; H01L 24/96; H01L 24/97
See application file for complete search history.

(56) References Cited

U.S. PATENT DOCUMENTS

| | | | |
|---|---|---|---|
| 6,583,003 B1 * | 6/2003 | Hsu | G11C 13/0007 257/E27.004 |
| 2013/0062620 A1 * | 3/2013 | Henning | H01L 29/872 257/77 |

* cited by examiner

*Primary Examiner* — Su C Kim
(74) *Attorney, Agent, or Firm* — Renner, Otto, Boisselle & Sklar, LLP

(57) ABSTRACT

The invention provides a power semiconductor device and a method of fabricating the same and a cutoff ring. A cutoff ring located at a periphery of an active area of the power semiconductor device is etched forming at least one trench below which an implant area is formed by implanting ions into the trench, and a silicon dioxide dielectric layer covering the trench and a surface of the active area, are formed. Since the ions are implanted into the trench formed by etching the cutoff ring to thereby increase a depth of the implanted ions and a density of the cutoff ring, a width of the cutoff ring can be shortened to thereby address the technical problem of a considerable area of a chip occupied by the cutoff ring and improve a utilization ratio of the area of the chip so as to lower a cost of fabricating the chip.

9 Claims, 3 Drawing Sheets

POWER SEMICONDUCTOR DEVICE AND METHOD OF FABRICATING THE SAME AND CUTOFF RING

CROSS-REFERENCES TO RELATED APPLICATIONS

The present application claims priority of Chinese patent application No. 201410042993.9, filed on Jan. 28, 2014, the content of which is incorporated herein by reference in its entirety.

FIELD

The present invention relates to the field of semiconductors and particularly to a power semiconductor device and a method of fabricating the same and a cutoff ring.

BACKGROUND

At present, in order to improve performance of a power semiconductor device in a chip to block high voltage and reliability of the device, divider structure and the cutoff ring are typically arranged sequentially at a periphery of an active area of the power semiconductor device, and moreover, scribe line can be further arranged at the periphery of the cutoff ring, thus forming the power semiconductor device as illustrated in FIG. 1. FIG. 1 is a schematic structural diagram of the power semiconductor device in the prior art in a cross section, 11 represents the active area, 12 represents the divider structure, 13 represents the cutoff ring and 14 represents the scribe line. If the power semiconductor device is an N-type substrate, then the divider structure therein is P-type dopants, and N-type dopants in a high dosage are implanted into a periphery of the power semiconductor device, thus forming the cutoff ring as illustrated in FIG. 1.

However the cutoff ring in the prior art is fabricated by implanting ions at the periphery of the power semiconductor device, so that the cutoff ring has a greater width, resulting in occupying a considerable area of the chip, and lowering a utilization ratio of the area of the chip and consequently increasing a cost of fabricating the chip.

SUMMARY

Embodiments of the invention provide a power semiconductor device and a method of fabricating the same and a cutoff ring so as to address the problem in the prior art of a considerable area of the chip occupied by the wide cutoff ring.

In an aspect, an embodiment of the invention provides a power semiconductor device including an active area, a cutoff ring located at a periphery of the active area, and a divider area located between the active area and the cutoff ring, wherein the cutoff ring include:
  at least one trench;
  a silicon dioxide dielectric layer covering the trench and a surface of the active area; and
  an implant area located below the trench,
  wherein the implant area is formed by implanting ions into the trench.

With the power semiconductor device described above, the power semiconductor device further includes a scribe line located at the periphery of the cutoff ring.

With the power semiconductor device described above, the silicon dioxide dielectric layer has a thickness between about 0.1 µm and 5 µm, and the trench has a depth between about 0.1 µm and 10 µm.

In another aspect, an embodiment of the invention provides a method of fabricating a power semiconductor device including an active area and a cutoff ring located at a periphery of the active area, wherein the method includes:
  forming at least one trench by etching the cutoff ring;
  implanting ions into the trench to form an implant area located below the trench; and
  performing thermal oxidation on the power semiconductor device to form a silicon dioxide dielectric layer covering the trench and a surface of the active area.

With the method of fabricating the power semiconductor device described above, the power semiconductor device further includes a scribe line located at the periphery of the cutoff ring;
  forming the at least one trench by etching the cutoff ring includes:
  coating a photoresist on surfaces of the scribe line, the divider area and the active area and the surface of the cutoff ring;
  exposing and developing the photoresist to expose a part of the surface of the cutoff ring; and
  forming the trench in the exposed part of the cutoff ring by using a dry etching which is one of a reactive ion etching and an inductive coupling plasmas etching; and
  after the ions are implanted into the trench to form the implant area located below the trench, the method further includes:
  removing the photoresist.

With the method of fabricating the power semiconductor device described above, the photoresist has a thickness between about 1 µm and 10 µm.

With the method of fabricating a power semiconductor device described above, the performing thermal oxidation on the power semiconductor device includes:
  performing thermal oxidation on the power semiconductor device using a dry oxidization or wet oxidization to form the silicon dioxide dielectric layer covering the trench and the surface of the active area.

With the method of fabricating the power semiconductor device described above, the implanting the ions into the trench to form the implant area located below the trench includes:
  implanting the ions into the trench using a multi-energy implantation to form the implant area located below the trench.

With the method for fabricating a power semiconductor device described above, the ions are implanted at an energy ranging from 100 KeV to 400 KeV, and the implanted ions include at least one of hydrogen ions, helium ions, boron ions, arsenic ions, phosphorus ions and aluminum ions.

In a further aspect, an embodiment of the invention provides a cutoff ring located at a periphery of an active area of a power semiconductor device, wherein the cutoff ring includes
  at least one trench;
  a silicon dioxide dielectric layer covering the trench; and
  an implant area located below the trench,
  wherein the implant area is formed by implanting ions into the trench.

With the power semiconductor device and the method of fabricating the same and the cutoff ring according to the embodiments of the invention, the cutoff ring located at the periphery of the active area of the power semiconductor device is etched forming the at least one trench below which the implant area formed by implanting the ions into the trench, and the silicon dioxide dielectric layer covering the trench and the surface of the active area, are formed. Since the ions are implanted into the trench formed by etching the cutoff ring to thereby increase a depth of the implanted ions as compared with the prior art, and with the same performance of blocking high voltage, the inventive solution can shorten a width of the cutoff ring to thereby address the technical problem of a considerable area of a chip occupied by the cutoff ring and improve a utilization ratio of the area of the chip so as to lower a cost of fabricating the chip.

DETAILED DESCRIPTION OF THE EMBODIMENTS

In order to make the objects, the technical solutions and advantages of the embodiments of the invention more apparent, the technical solutions according to the embodiments of the invention will be described below clearly and fully with reference to the drawings in the embodiments of the invention. For the sake of a convenient description, sizes of different layers and areas have been exaggerated or shrunk, so the sizes and proportions illustrated in the figures may not necessarily represent real sizes or reflect proportional relationships between the sizes.

Figure 1:
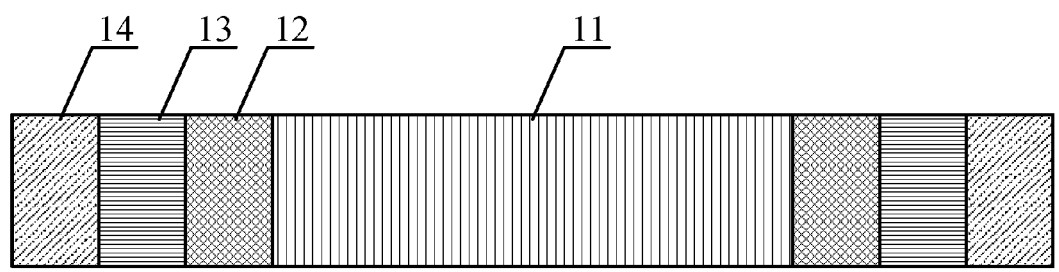
FIG. 1 is a schematic structural diagram of the power semiconductor device in the prior art in a cross section.
Figure 2:
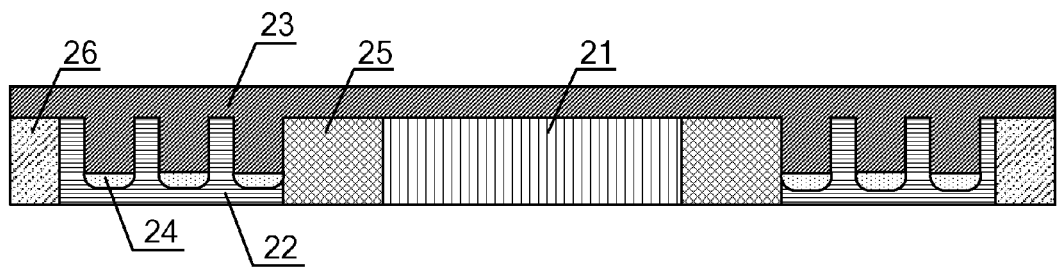
FIG. 2 is a schematic structural diagram of a power semiconductor device according to an embodiment of the invention in a cross section.

FIG. 2 is a schematic structural diagram of a power semiconductor device according to an embodiment of the invention in a cross section. As illustrated in FIG. 2, the power semiconductor device includes an active area 21, a cutoff ring 22 located at a periphery of the active area 21, and a divider area 25 located between the active area 21 and the cutoff ring 22. The cutoff ring 22 includes at least one trench. The power semiconductor further includes a silicon dioxide dielectric layer 23 covering the trench and a surface of the active area 21, and an implant area 24 located below the trench, the implant area 24 being formed by implanting ions into the trench.

Furthermore the silicon dioxide dielectric layer has a thickness between about 0.1 µm and 5 µm, and the trench has a depth between about 0.1 µm and 10 µm.

Furthermore the power semiconductor device further includes a scribe line 26 located at periphery of the cutoff ring 22.

In this embodiment, the cutoff ring located at the periphery of the active area of the power semiconductor device is etched forming the at least one trench below which the implant area is formed by implanting the ions into the trench, and the silicon dioxide dielectric layer covering the trench and the surface of the active area, are arranged. Since the ions are implanted into the trench formed by etching the cutoff ring to thereby increase a depth of the implanted ions and a density of the cutoff ring, a width of the cutoff ring can be shortened to thereby address the technical problem of a considerable area of a chip occupied by the cutoff rings and improve a utilization ratio of the area of the chip so as to lower a cost of fabricating the chip. Moreover since the silicon dioxide dielectric layer is formed on the trench and the surface of the active area by thermal oxidation, the implant area and the side surfaces of the at least one trench may be protected from surface charges to thereby improve reliability of the cutoff ring.

Figure 3:
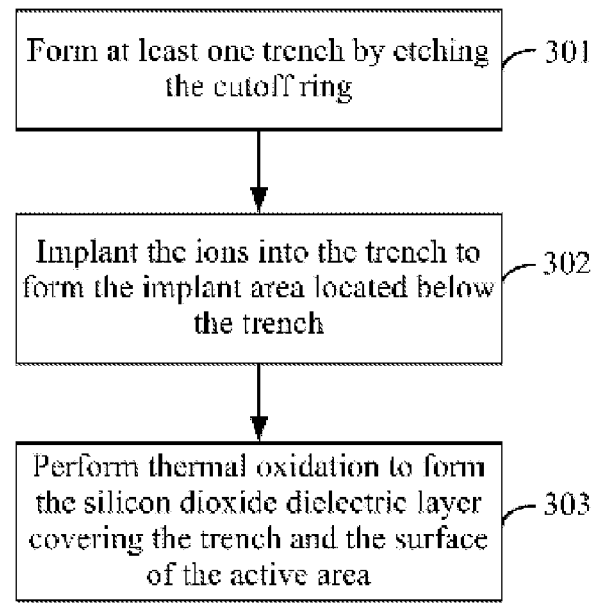
FIG. 3 is a schematic flow chart of a method of fabricating a power semiconductor device according to an embodiment of the invention.

FIG. 3 is a schematic flow chart of a method of fabricating a power semiconductor device according to an embodiment of the invention. For the sake of a clear and systematic description of the method in this embodiment, FIG. 4 to FIG. 7 are schematic structural diagrams of the power semiconductor device in the embodiment in cross sections. The power semiconductor device includes the active area 21 and the cutoff ring 22 located at the periphery of the active area, and as illustrated in FIG. 3, the method of fabricating a power semiconductor device includes the following operations:

Operation 301: form at least one trench by etching the cutoff ring.

The power semiconductor device further includes the divider area 25 located between the active area 21 and the cutoff ring 22, and the scribe line 26 located at the periphery of the cutoff ring.

Figure 4:
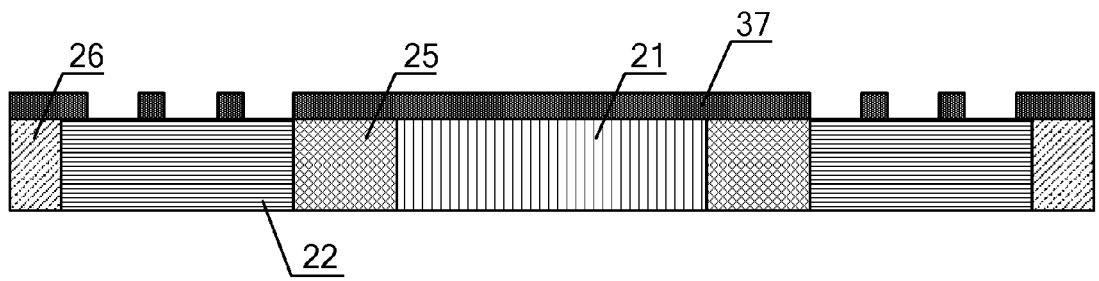
FIG. 4 to FIG. 7 are schematic structural diagrams of the power semiconductor device in the embodiment in cross sections.
Figure 5:
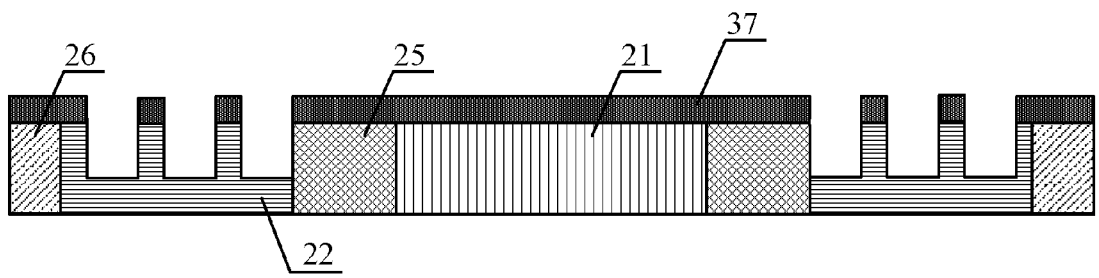

Optionally the surfaces of the scribe line, the divider area and the active area and the surface of the cutoff ring are coated with a photoresist 37; and the preset area of the surface of the cutoff ring is exposed by exposing and developing the photoresist 37, so that a part of the surface of the cutoff ring is exposed to form the power semiconductor device as illustrated in FIG. 4. Then the exposed part of the cutoff ring is etched using a dry etching which is one of a reactive ion etching and an inductive coupling plasmas etching to form the at least one trench, thus forming the power semiconductor device as illustrated in FIG. 5. The photoresist 37 has a thickness between about 1 µm and 10 µm.

Operation 302: implant the ions into the trench to form the implant area located below the trench.

Figure 6:
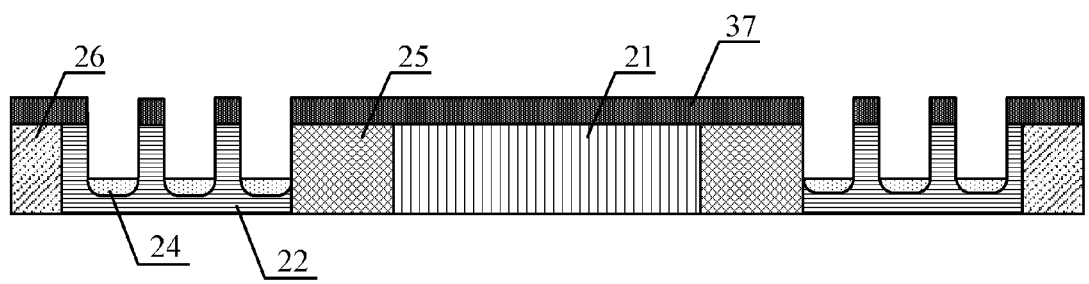
Figure 7:
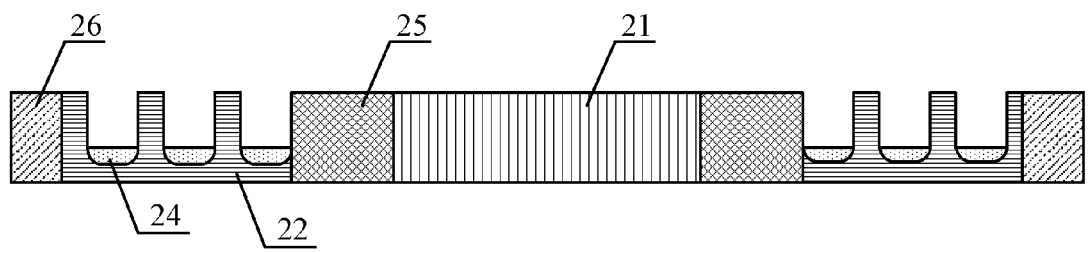

Optionally the ions are implanted into the trench using a multi-energy implantation to form at least one implant area 24 located below the at least one trench, thus forming the power semiconductor device as illustrated in FIG. 6. The ions are implanted at an energy ranging from 100 KeV to 400 KeV, and the implanted ions include at least one of hydrogen ions, helium ions, boron ions, arsenic ions, phosphorus ions and aluminum ions. After the ions are implanted into the at least one trench to form the implant area located below the trench, the photoresist 37 covering the surfaces of the scribe line 26, the divider area 25 and the active area 21 and the surface of the cutoff ring 22 is further removed forming the power semiconductor device as illustrated in FIG. 7.

Operation 303: perform thermal oxidation to form the silicon dioxide dielectric layer covering the trench and the surface of the active area.

Optionally thermal oxidation process is performed on the power semiconductor device using a dry oxidation or wet oxidation method to thereby form the silicon dioxide dielectric layer 23 covering the trench and the surface of the active area 21, thus forming the power semiconductor device as illustrated in FIG. 2, herein, the silicon dioxide dielectric layer 23 has a thickness between about 0.1 μm and 5 μm.

In this embodiment, the cutoff ring located at the periphery of the active area of the power semiconductor device are etched to form the at least one trench below each of which the implant area is formed by implanting the ions into the trench, and the silicon dioxide dielectric layer covering the trench and the surface of the active area, are arranged. Since the ions are implanted into the trench formed by etching the cutoff ring to thereby attain effects of a physical cutoff and an electrical cutoff and increase a depth of the implanted ions and a density of the cutoff ring, a width of the cutoff ring can be shortened to thereby address the technical problem of a considerable area of a chip occupied by the cutoff ring and improve a utilization ratio of the area of the chip so as to lower a cost of fabricating the chip. Moreover since the silicon dioxide dielectric layer is formed on the trench and the surface of the active area by thermal oxidation, implant area and the side surface of the trench may be protected from surface charges to thereby improve reliability of the cutoff ring.

Figure 8:
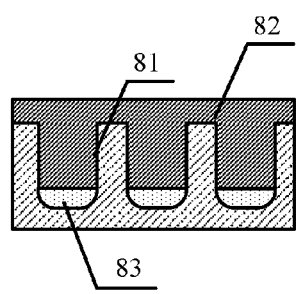
FIG. 8 is a schematic structural diagram of a cutoff ring according to another embodiment of the invention in a cross section.

FIG. 8 is a schematic structural diagram of a cutoff ring according to another embodiment of the invention in a cross section, the cutoff ring being located at a periphery of an active area of a power semiconductor device. As illustrated in FIG. 8, the cutoff ring includes at least one trench 81, a silicon dioxide dielectric layer 82 covering the trench 81, and an implant area 83 located below the trench 81, the implant area 83 being formed by implanting ions into the trench 81.

Furthermore the silicon dioxide dielectric layer 82 has a thickness between about 0.1 μm and 5 μm, and the trench 81 has a depth between about 0.1 μm and 10 μm.

In this embodiment, the cutoff ring located at the periphery of the active area of the power semiconductor device is etched to form the at least one trench below which the implant area formed by implanting the ions into the trench, and the silicon dioxide dielectric layer covering the trench, are arranged, and since the ions are implanted into the trench formed by etching the cutoff ring to thereby increase a depth at which the ions are implanted and a density of the cutoff ring, a width of the cutoff ring can be shortened to thereby address the technical problem of a considerable area of a chip occupied by the cutoff ring and improve a utilization ratio of the area of the chip so as to lower a cost of fabricating the chip. Moreover since the silicon dioxide dielectric layer is formed on the trench and the surface of the active area through thermal oxidization, the implant area and the side surface of the trench may be protected from surface charges to thereby improve reliability of the cutoff rings.

Those skilled in the art can clearly appreciate that reference can be made to the corresponding process in the embodiment of the method above for particular methods for fabricating the device in the respective embodiments above for the sake of a convenient and concise description.

Lastly it shall be noted that the foregoing embodiments are intended to merely illustrate but not limit the technical solution of the invention, and although the invention has been detailed in connection with the foregoing embodiments, those ordinarily skilled in the art shall appreciate that they still can modify the technical solution recited in the respective embodiments or substitute equivalently a part of technical features therein without departing from the scope of the technical solution in the respective embodiments of the invention.

The invention claimed is:

1. A method of fabricating a power semiconductor device comprising an active area and a cutoff ring located at a periphery of the active area, wherein the method comprises:
    forming at least one trench by etching the cutoff ring;
    implanting ions into the trench to form an implant area located below the trench; and
    performing thermal oxidation on the power semiconductor device to form a silicon dioxide dielectric layer covering the trench and a surface of the active area;
    wherein the power semiconductor device further comprises a scribe line located at a periphery of the cutoff ring;
    forming at least one trench by etching the cutoff ring comprises:
    coating a photoresist on surfaces of the scribe line, a divider area and the active area and a surface of the cutoff ring;
    exposing and developing the photoresist to expose a part of the surface of the cutoff ring; and
    forming the trench in the exposed part of the cutoff ring by using a dry etching which is one of a reactive ion etching and an inductive coupling plasmas etching; and
    after the ions are implanted into the trench to form the implant area located below the trench, the method further comprises:
    removing the photoresist.

2. The method of fabricating the power semiconductor device according to claim 1, wherein the photoresist has a thickness between about 1 μm and 10 μm.

3. The method of fabricating the power semiconductor device according to claim 1, wherein the performing thermal oxidation on the power semiconductor device comprises:
    performing thermal oxidation on the power semiconductor device using a dry oxidization or wet oxidization to form the silicon dioxide dielectric layer covering the trench and the surface of the active area.

4. The method of fabricating the power semiconductor device according to claim 1, wherein the implanting the ions into the trench to form the implant area located below the trench comprises:
    implanting the ions into the trench using a multi-energy implantation to form the implant area located below the trench.

5. The method of fabricating the power semiconductor device according to claim 4, wherein the ions are implanted at an energy between about 100 KeV and 400 KeV, and the implanted ions comprise at least one of hydrogen ions, helium ions, boron ions, arsenic ions, phosphorus ions and aluminum ions.

6. The method of fabricating the power semiconductor device according to claim 2, wherein the implanting the ions into the trench to form the implant area located below the trench comprises:
    implanting the ions into the trench using a multi-energy implantation to form the implant area located below the trench.

7. The method of fabricating the power semiconductor device according to claim 6, wherein the ions are implanted at an energy between about 100 KeV and 400 KeV, and the implanted ions comprise at least one of hydrogen ions, helium ions, boron ions, arsenic ions, phosphorus ions and aluminum ions.

8. The method of fabricating the power semiconductor device according to claim 3, wherein the implanting the ions into the trench to form the implant area located below the trench comprises:

implanting the ions into the trench using a multi-energy implantation to form the implant area located below the trench.

9. The method of fabricating the power semiconductor device according to claim 8, wherein the ions are implanted at an energy between about 100 KeV and 400 KeV, and the implanted ions comprise at least one of hydrogen ions, helium ions, boron ions, arsenic ions, phosphorus ions and aluminum ions.

* * * * *